United States Patent
Shigenobu (10) Patent No.: US 7,643,125 B2
(45) Date of Patent: Jan. 5, 2010

(54) EXPOSURE APPARATUS AND DEVICE MANUFACTURING METHOD

(75) Inventor: Atsushi Shigenobu, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 12/137,614

(22) Filed: Jun. 12, 2008

(65) Prior Publication Data

US 2008/0316443 A1  Dec. 25, 2008

(30) Foreign Application Priority Data

Jun. 20, 2007  (JP)  ............................. 2007-163018

(51) Int. Cl.
  G03B 27/68  (2006.01)
  G03B 27/52  (2006.01)

(52) U.S. Cl. .......................................... 355/52; 355/55

(58) Field of Classification Search ................... 355/52, 355/56, 55, 67, 77, 53; 356/399–401; 359/359
See application file for complete search history.

(56) References Cited

U.S. PATENT DOCUMENTS 6,633,390 B2 * 10/2003 Shiode et al. ............... 356/620
7,088,426 B2 * 8/2006 Hirukawa et al. ............. 355/55
7,262,831 B2 * 8/2007 Akhssay et al. ............... 355/52

FOREIGN PATENT DOCUMENTS

JP       2000-147232 A       5/2000

* cited by examiner

Primary Examiner—Hung Henry Nguyen
(74) Attorney, Agent, or Firm—Canon U.S.A. Inc., I.P. Division

(57) ABSTRACT

An exposure apparatus includes a first driving mechanism which drives a first optical element, a second driving mechanism which drives a second optical element, and a control unit which controls the first driving mechanism and the second driving mechanism so as to adjust the astigmatism of a projection optical system. The amount of change in the first order component of the astigmatism and the amount of change in the second order component of the astigmatism upon driving the first optical element by the first driving mechanism have a first ratio, and the amount of change in the first order component of the astigmatism and the amount of change in the second order component of the astigmatism upon driving the second optical element by the second driving mechanism have a second ratio which is different from the first ratio.

8 Claims, 6 Drawing Sheets

| PART NUMBER | SURFACE NUMBER | RADIUS OF CURVATURE (mm) | SURFACE INTERVAL (mm) | GLASS MATERIAL |
|---|---|---|---|---|
| G1 | 1 | 818.81597 | 23.14313 | $SiO_2$ |
|  | 2 | -247.34861 | 23.6483 |  |
| G2 | 3 | -272.27915 | 15 | $SiO_2$ |
|  | 4 | -1120.58463 | 1 |  |
| G3 | 5 | 444.39228 | 22.20115 | $SiO_2$ |
|  | 6 | -580.35263 | 35.41712 |  |
| G4 | 7 | -4523.2048 | 15.24964 | $SiO_2$ |
|  | 8 | -446.14592 | 58.56371 |  |
| G5 | 9 | 783.53447 | 17.92753 | $SiO_2$ |
|  | 10 | -474.54238 | 1 |  |
| G6 | 11 | 117.93848 | 28.88238 | $SiO_2$ |
|  | 12 | 946.0287 | 26.78585 |  |
| G7 | 13 | 418.30815 | 52.61328 | $SiO_2$ |
|  | 14 | -1987.76889 | 21.3176 |  |
| G8 | 15 | -89.95201 | 12.9 | $SiO_2$ |
|  | 16 | -146.97057 | 62.63413 |  |
| G9 | 17 | -94.70819 | 18.80086 | $SiO_2$ |
|  | 18 | -141.24398 | 17.63229 |  |
| G10 | 19 | -356.22086 | 24.64803 | $SiO_2$ |
|  | 20 | -221.61818 | 1 |  |
| G11 | 21 | -749.31334 | 54.13067 | $SiO_2$ |
|  | 22 | -190.96409 | 1 |  |
| G12 | 23 | -2088.24682 | 33.50817 | $SiO_2$ |
|  | 24 | -312.5227 | 193.17291 |  |
| G13 | 25 | 392.21036 | 50.84129 | $SiO_2$ |
|  | 26 | 5064.9001 | 14.22486 |  |
| G14 | 27 | 274.73163 | 41.49067 | $SiO_2$ |
|  | 28 | 607.74068 | 293.50954 |  |
| G15 | 29 | -217.89713 | 23.52297 | $SiO_2$ |
|  | 30 | -576.96924 | 36.71521 |  |

FIG. 5B

| PART NUMBER | SURFACE NUMBER | RADIUS OF CURVATURE (mm) | SURFACE INTERVAL (mm) | GLASS MATERIAL |
|---|---|---|---|---|
| G16 | 31 | -133.39279 | 15.00006 | SiO$_2$ |
|  | 32 | -1796.50645 | 33.92345 |  |
| G17 | 33 | -139.79119 | 22.70396 | SiO$_2$ |
|  | 34 | -455.94044 | 41.6382 |  |
| Mirror | 35 | -190.16577 | -41.6382 |  |
| G17 | 36 | -455.94044 | -22.70396 | SiO$_2$ |
|  | 37 | -139.79119 | -33.92345 |  |
| G16 | 38 | -1796.50645 | -15.00006 | SiO$_2$ |
|  | 39 | -133.39279 | -36.71521 |  |
| G15 | 40 | -576.96924 | -23.52297 | SiO$_2$ |
|  | 41 | -217.89713 | -293.50954 |  |
| G14 | 42 | 607.74068 | -41.49067 | SiO$_2$ |
|  | 43 | 274.73163 | -14.22486 |  |
| G13 | 44 | 5064.9001 | -50.84129 | SiO$_2$ |
|  | 45 | 392.21036 | -73.17291 |  |
| FM1 | 46 | 0 | 498.10328 |  |
| FM2 | 47 | 0 | -95 |  |
| G18 | 48 | -315.29341 | -48.56566 | SiO$_2$ |
|  | 49 | -1433.89893 | -1.00817 |  |
| G19 | 50 | -246.12647 | -50.76484 | SiO$_2$ |
|  | 51 | -718.58 | -95.43217 |  |
| G20 | 52 | 393.83195 | -17.5 | SiO$_2$ |
|  | 53 | -748.07119 | -47.03871 |  |
| G21 | 54 | -1306.50805 | -15 | SiO$_2$ |
|  | 55 | -250.52581 | -31.15835 |  |
| G22 | 56 | -985.18445 | -15 | SiO$_2$ |
|  | 57 | -217.48984 | -83.77495 |  |
| G23 | 58 | -3169.8111 | -39.35369 | SiO$_2$ |
|  | 59 | 325.10882 | -1 |  |
| G24 | 60 | -424.77235 | -69.59998 | SiO$_2$ |
|  | 61 | 541.42553 | -22.21049 |  |
| G25 | 62 | 335.52519 | -25 | SiO$_2$ |
|  | 63 | 1085.60933 | -42.69733 |  |
| G26 | 64 | -645.77026 | -31.91298 | SiO$_2$ |
|  | 65 | -4199.06678 | -18 |  |
| APERTURE STOP | 66 | 0 | 15.28974 |  |
| G27 | 67 | -584.26074 | -40.70085 | SiO$_2$ |
|  | 68 | 3400.43228 | -2.66518 |  |
| G28 | 69 | -296.00597 | -58.98251 | SiO$_2$ |
|  | 70 | -3249.63702 | -2.99788 |  |
| G29 | 71 | -174.75047 | -50.87952 | SiO$_2$ |
|  | 72 | -417.06623 | -3.65293 |  |
| G30 | 73 | -96.87963 | -57.96772 | CaF$_2$ |
|  | 74 | -185.9659 | -1 |  |
| G31 | 75 | -71.13104 | -42.03329 | CaF$_2$ |
|  | 76 | 0 | -2.87554 | water |

FIG. 6

|  | ANGLE OF VIEW : 6.4mm | | ANGLE OF VIEW : 14.5mm | |
|---|---|---|---|---|
|  | ΔC5(mλ) | ΔC12(mλ) | ΔC5(mλ) | ΔC12(mλ) |
| G1 | -0.5 | 0.0 | -1.6 | 0.0 |
| G2 | -4.9 | 0.0 | -5.5 | 0.0 |
| G3 | -3.7 | 0.1 | -6.7 | 0.3 |
| G4 | -13.2 | 0.9 | -10.7 | 1.0 |
| G5 | -10.8 | 2.2 | -6.3 | 1.6 |
| G6 | -5.0 | 2.5 | -4.4 | 1.2 |
| G7 | 1.3 | -0.4 | 0.8 | -0.5 |
| G8 | 9.2 | 1.6 | 12.7 | 1.4 |
| G9 | 7.4 | 1.2 | 9.6 | 0.4 |
| G10 | 7.1 | -2.1 | 5.1 | 0.7 |
| G11 | 4.9 | -3.8 | 3.8 | 1.0 |
| G12 | -0.7 | -1.8 | 7.5 | 0.5 |
| G13 | 0.0 | 0.5 | -2.1 | 0.5 |
| G14 | -1.5 | 1.6 | -3.4 | 0.3 |
| G15 | 2.3 | -1.1 | 0.2 | -0.9 |
| G16 | -6.2 | -6.6 | -15.6 | -5.7 |
| G17 | -40.2 | -5.5 | -47.2 | -1.3 |
| G18 | 5.7 | -2.6 | 21.7 | -2.4 |
| G19 | 15.8 | -3.1 | 14.7 | -1.2 |
| G20 | -22.8 | 1.2 | -7.6 | -1.5 |
| G21 | 31.5 | 5.6 | 35.4 | 5.6 |
| G22 | 98.8 | 22.4 | 102.0 | 24.2 |
| G23 | -31.9 | -27.6 | -45.9 | -30.4 |
| G24 | -0.6 | -17.1 | -5.5 | -17.9 |
| G25 | -143.4 | -24.6 | -146.1 | -27.3 |
| G26 | 13.3 | -30.0 | 9.5 | -29.9 |
| G27 | 21.5 | 9.4 | 21.2 | 9.9 |
| G28 | 19.6 | 15.4 | 21.7 | 15.3 |
| G29 | 13.4 | 7.8 | 15.5 | 7.7 |
| G30 | 2.4 | 4.6 | 3.8 | 5.6 |
| G31 | -7.3 | -0.9 | -7.0 | -1.1 |

EXPOSURE APPARATUS AND DEVICE MANUFACTURING METHOD

BACKGROUND OF THE INVENTION

1. Field of the Invention

The present invention relates to an exposure apparatus and a device manufacturing method using the same.

2. Description of the Related Art

An exposure apparatus which projects the pattern of an original (also called a reticle or mask) onto a substrate (wafer) via a projection optical system to expose the substrate to light is used in lithography for manufacturing a device such as a semiconductor device. To manufacture large-scale integrated devices, it is necessary to minimize the aberration of the projection optical system.

However, when the projection optical system receives an exposure load (heat) upon substrate exposure, its optical elements deform. This may result in an image shift on the optical axis, for example, astigmatism on the entire surface of the projection optical system. The astigmatism means an aberration in which light which emerges from one off-axis point diverges into two orthogonal light beams shifted forward and backward from each other without converging to one point after passing through the lens. If astigmatism is present, the hole shape changes due to defocusing. To solve this problem, an astigmatism correction mechanism has been proposed.

Figure 1:
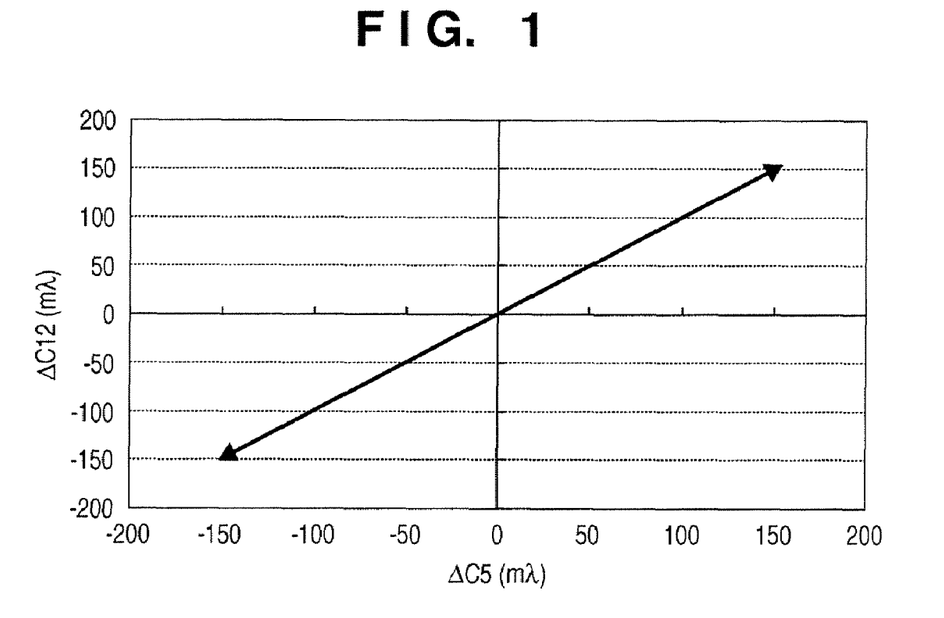
FIG. 1 is a graph illustrating the relationship between the C5 and C12 terms in an astigmatism correction mechanism.

FIG. 1 is a graph illustrating the relationship between the C5 and C12 terms of the Zernike polynomials when the astigmatism correction mechanism performs aberration correction. The abscissa indicates the amount of change in the C5 term (corresponding to a low-order component of astigmatism), and the ordinate indicates the amount of change in the C12 term (corresponding to a high-order component of astigmatism). The C5 and C12 terms are mutually dependent such that the C12 term is determined if the C5 term is given, while the C5 term is determined if the C12 term is given.

If the ratio between a low-order component and high-order component of the aberration amount to be corrected is close to that of the sensitivity of the correction mechanism, it is possible to correct the aberration of the projection optical system with high accuracy. On the other hand, if these ratios are largely different from each other, the high-order aberration component deteriorates when the low-order aberration component is corrected with high accuracy, while the low-order aberration component deteriorates when the high-order aberration component is corrected with high accuracy. The ratio between the low-order component and high-order component of astigmatism generated by exposure heat changes depending on the illumination conditions used. Hence, one astigmatism correction mechanism alone can hardly correct astigmatisms, which are generated under all the illumination conditions, with high accuracy.

SUMMARY OF THE INVENTION

The present invention has been made in consideration of the above-described problem, and has as its object to provide an exposure apparatus which can adjust, for example, at least two components of the astigmatism of a projection optical system with higher accuracy.

The present invention relates to an exposure apparatus which exposes a substrate. The exposure apparatus includes a projection optical system which includes a first optical element and a second optical element and projects the pattern of an original onto the substrate, a first driving mechanism which drives the first optical element, a second driving mechanism which drives the second optical element, and a control unit which controls the first driving mechanism and the second driving mechanism so as to adjust the astigmatism of the projection optical system. The amount of change in the first order component of the astigmatism and the amount of change in the second order component of the astigmatism upon driving the first optical element by the first driving mechanism have a first ratio, and the amount of change in the first order component of the astigmatism and the amount of change in the second order component of the astigmatism upon driving the second optical element by the second driving mechanism have a second ratio which is different from the first ratio.

According to the present invention, it is possible to adjust at least two components of the astigmatism of a projection optical system with a higher accuracy.

Further features of the present invention will become apparent from the following description of exemplary embodiments with reference to the attached drawings.

DESCRIPTION OF THE EMBODIMENT

A preferred embodiment of the present invention will be described below with reference to the accompanying drawings.

Figure 3:
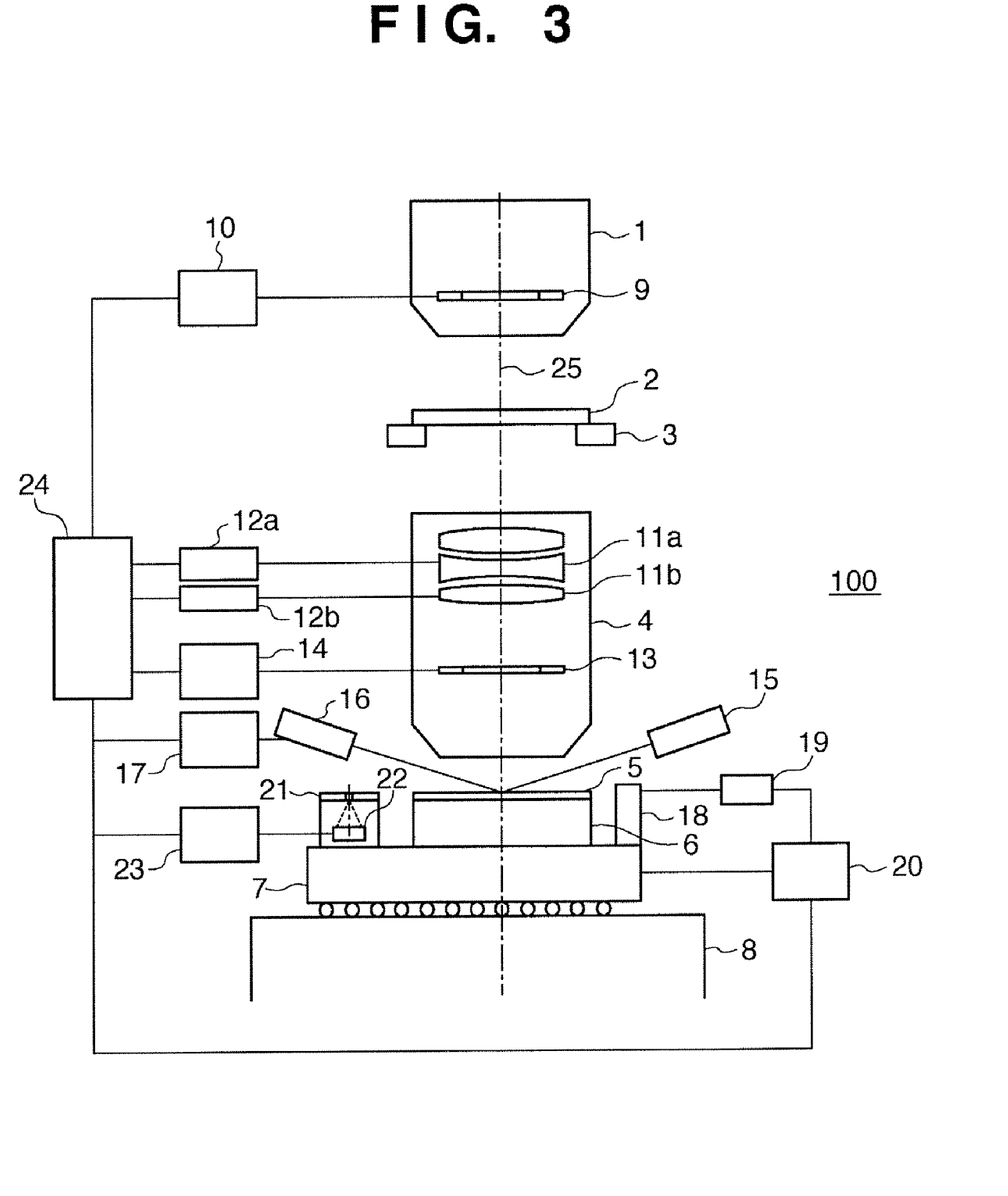
FIG. 3 is a view showing the schematic arrangement of an exposure apparatus for manufacturing a device.

FIG. 3 is a view showing the schematic arrangement of an exposure apparatus for manufacturing a device such as a semiconductor device or liquid crystal device. An illumination optical system 1 in an exposure apparatus 100 shown in FIG. 3 illuminates an original (reticle) 2 on which a device pattern is formed. The illumination optical system 1 includes an aperture stop 9. A driving mechanism 10 has a function of changing the aperture size and shape of the aperture stop 9. This makes it possible to change the effective light source distribution.

The original 2 is driven by an original stage driving mechanism while being held by an original stage (reticle stage) 3. The pattern of the original 2 is projected onto a substrate (wafer) 5 via a projection optical system 4, thereby exposing the substrate 5 to light. The substrate 5 is held by a substrate chuck 6. The substrate chuck 6 is mounted on a substrate stage 7 and includes a mechanism for adjusting the level of the substrate 5. The substrate stage 7 is driven by a substrate stage driving mechanism.

The projection optical system 4 can include a plurality of optical elements (lenses and mirrors). The projection optical system 4 includes a first optical element 11a and second optical element 11b as some of the plurality of optical elements. The first optical element 11a and second optical element 11b are preferably situated near the pupil of the projection optical system 4. The exposure apparatus 100 comprises a first driving mechanism 12a which drives the first optical element 11a, and a second driving mechanism 12b which drives the second optical element 11b. The exposure apparatus 100 also comprises a control unit 24 which controls the first driving mechanism 12a and second driving mechanism 12b so as to adjust the astigmatism of the projection optical system 4. The control unit 24 controls the first driving mechanism 12a and second driving mechanism 12b so that both the first order component (low-order component) and second order component (high-order component) of the astigmatism of the projection optical system 4 fall within a target range.

The first optical element 11a deforms, that is, its surface shape changes as it is driven by the first driving mechanism 12a, so that the astigmatism of the projection optical system 4 changes. The second optical element 11b deforms, that is, its surface shape changes as it is driven by the second driving mechanism 12b, so that the astigmatism of the projection optical system 4 changes.

The projection optical system 4 has an aperture stop 13 at its pupil position. The aperture stop 13 is optically conjugate to the aperture stop 9 of the illumination optical system 1, and its aperture size is variable. A driving mechanism 14 has a function of changing the aperture size (i.e., the numerical aperture of the projection optical system) of the aperture stop 13.

The exposure apparatus 100 comprises a surface position detector to detect the level (the position of the substrate 5 along an optical axis 25) of the substrate 5. The surface position detector includes a light-projecting unit 15 and light-receiving unit 16. Light which is emitted by the light-projecting unit 15 and reflected by the surface of the substrate 5 enters the light-receiving surface of the light-receiving unit 16. The output from the light-receiving unit 16 is sent to a processing unit 17. The processing unit 17 detects the level of the substrate 5 in accordance with the light incident position on the light-receiving surface of the light-receiving unit 16.

The position of the stage 7 is detected by a laser interferometer 19 using a reflecting mirror 18 fixed on the stage 7. A driving unit 20 performs feedback control of the position of the stage 7 on the basis of the detection result obtained by the laser interferometer 19. The driving unit 20 also controls the substrate chuck 6 so that the surface of the substrate 5 matches the imaging plane of the projection optical system 4, based on the substrate level information obtained by the processing unit 17.

Astigmatism correction of the projection optical system 4 will be explained. The first driving mechanism 12a can deform the first optical element 11a and the second driving mechanism 12b can deform the second optical element 11b in the following way.

A first support member can support the first optical element 11a and second optical element 11b at a plurality of points on their peripheral portions. The first support member can support the optical elements 11a and 11b at, for example, two points spaced apart from each other at an angle of 180° and a point slightly separated from one of these two points in the direction of gravity. The first support member can also support the optical elements 11a and 11b at a first point and a second point spaced apart from the first point at an angle of 120° (inclusive) to 180° (exclusive). The first support member can also support the optical elements 11a and 11b at three points spaced apart from each other at angles of 90°.

A second support member supports the first support member. One or a plurality of first driving mechanisms 12a are situated between the first support member which supports the first optical element 11a and the second support member which supports the first support member. Likewise, one or a plurality of second driving mechanisms 12b are situated between the first support member which supports the second optical element 11b and the second support member which supports the first support member.

Each of the driving mechanisms 12a and 12b can include an airtight chamber, pressure control unit, and lever member. The volume of the airtight chamber changes depending on its internal pressure. The pressure control unit controls the internal pressure of the airtight chamber. The lever member applies forces to the optical elements 11a and 11b upon receiving a force generated upon a change in the internal pressure of the airtight chamber. The above-described arrangement can cause 2θ deformation of the optical elements 11a and 11b due to their own weights. Providing the driving mechanisms 12a and 12b which can adjust the forces, which are acting at the portions deformed by their own weights, in a direction opposite to that of gravity makes it possible to actively adjust astigmatism. Although a case in which astigmatism is corrected by deforming the surfaces of optical elements has been exemplified, it is merely an example and any other method can be adopted.

An astigmatism correction mechanism including the first optical element 11a and first driving mechanism 12a will be called a first astigmatism correction mechanism hereinafter. An astigmatism correction mechanism including the second optical element 11b and second driving mechanism 12b will be called a second astigmatism correction mechanism hereinafter.

Figure 2:
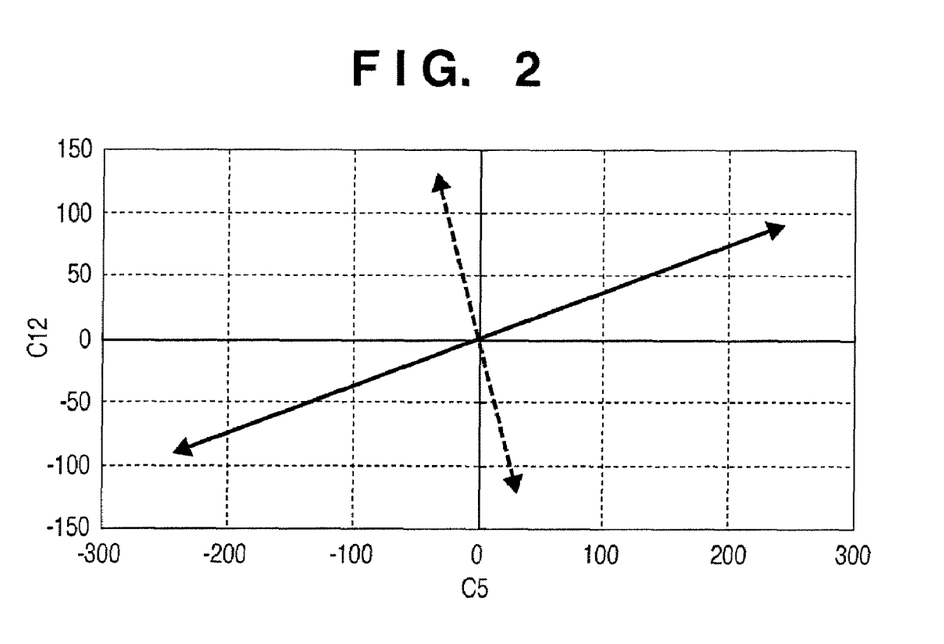
FIG. 2 is a graph illustrating the relationship between the C5 and C12 terms in two astigmatism correction mechanisms.

FIG. 2 illustrates the relationship between the C5 and C12 terms in the two astigmatism correction mechanisms. The abscissa indicates the sensitivity to (the amount of change in) the C5 term (first order astigmatism component), and the ordinate indicates the sensitivity to (the amount of change in) the C12 term (second order astigmatism component).

Let $C5_1$ and $C12_1$ be astigmatism components (C5 and C12 terms) generated by the first astigmatism correction mechanism. Let $C5_2$ and $C12_2$ be astigmatism components (C5 and C12 terms) generated by the second aberration correction mechanism. The correction target astigmatism components are defined as $C5_k$ and $C12_k$, and the amounts of deformation of the optical elements 11a and 11b are defined as α and β (assuming the amounts of deformation by their own weights as 1).

The relationship between the correction targets and the sensitivities of the astigmatism correction mechanisms can be expressed by:

$$\begin{pmatrix} C5_k \\ C12_k \end{pmatrix} = \alpha \begin{pmatrix} C5_1 \\ C12_1 \end{pmatrix} + \beta \begin{pmatrix} C5_2 \\ C12_2 \end{pmatrix} \qquad (1)$$

The matrix terms on the right side are known. Calculating α and β from equation (1) can yield the amounts of deformation of the optical elements 11a and 11b, which are required to generate the correction target astigmatism components. The ratio between the amounts of changes in the astigmatism $C5_1$ (first order component) and astigmatism $C12_1$ (second order component) generated by the first astigmatism correction mechanism is defined as the first ratio. The ratio between the amounts of changes in the astigmatism $C5_2$ (first order component) and astigmatism $C12_2$ (second order component) generated by the second astigmatism correction mechanism is defined as the second ratio. Then, if the first ratio is different from the second ratio, equation (1) can be solved. The first ratio and second ratio preferably have opposite signs. The first ratio and second ratio are determined to satisfy the correction targets.

As is obvious from equation (1), providing two astigmatism correction mechanisms makes it possible to correct the astigmatism components of two orders. To correct the astigmatism components of three or more orders, three or more astigmatism correction mechanisms are used accordingly.

The ratio between the amounts of changes in the C5 and C12 terms in the astigmatism correction mechanisms depends on the lens shape. In other words, as the differences in, for example, thickness and curvature between the two lenses increase, the difference in generation ratio between the C5 and C12 terms also increases. It is therefore possible to set, based on this principle, different ratios between the amounts of changes in astigmatism components generated by the astigmatism correction mechanisms. When a lens with a thickness and curvature different from those of the first astigmatism correction mechanism as much as possible is selected for the second astigmatism correction mechanism, it is possible to set different first ratio and second ratio. The optical elements 11a and 11b shown in FIG. 3 have different thicknesses and curvatures.

Situating the first and second astigmatism correction mechanisms near the pupil of the projection optical system 4 makes it possible to correct astigmatism with a smaller dependence on the image height.

Figure 4:
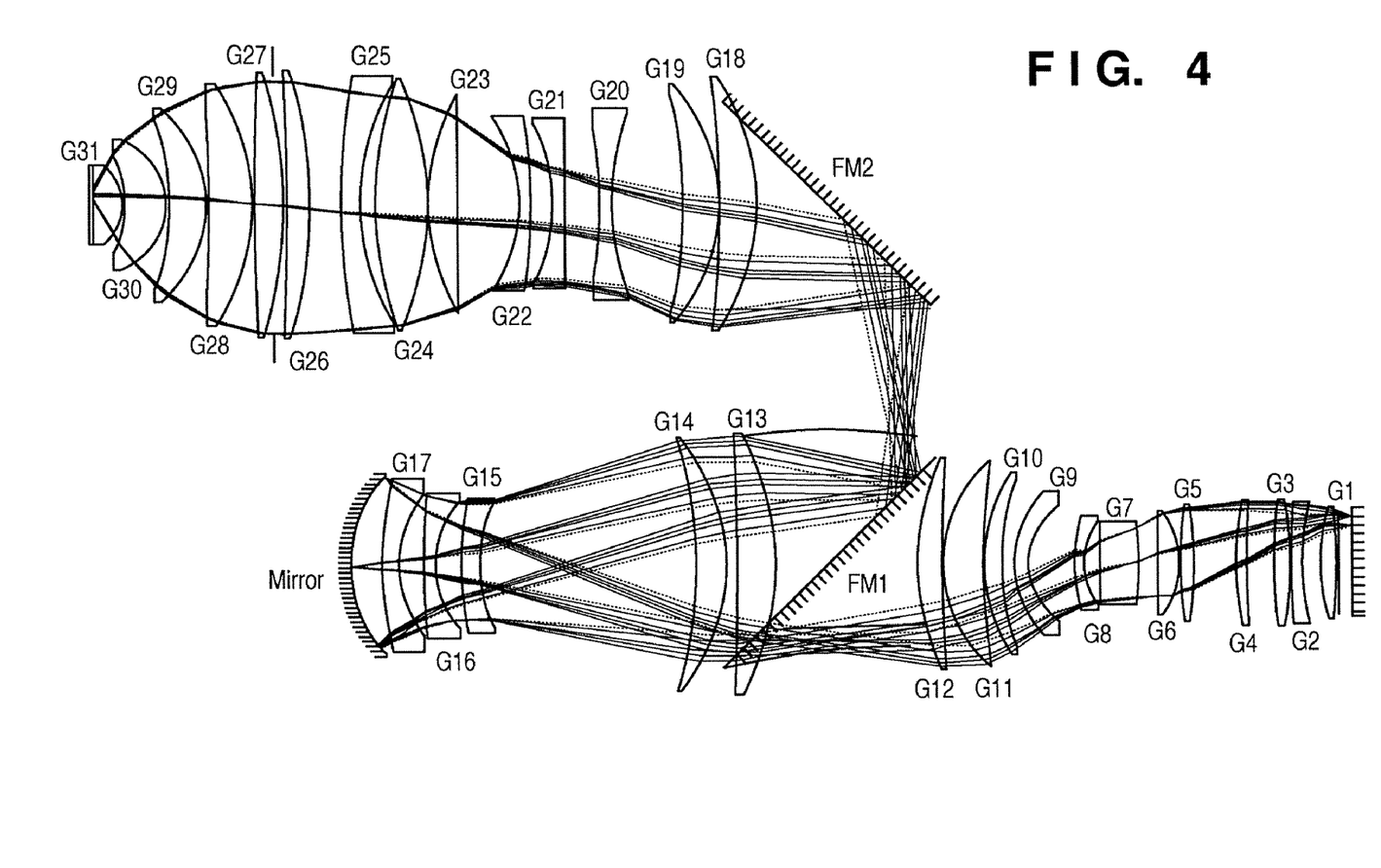
FIG. 4 is a sectional view showing an arrangement of a projection optical system.
Figure 5A:
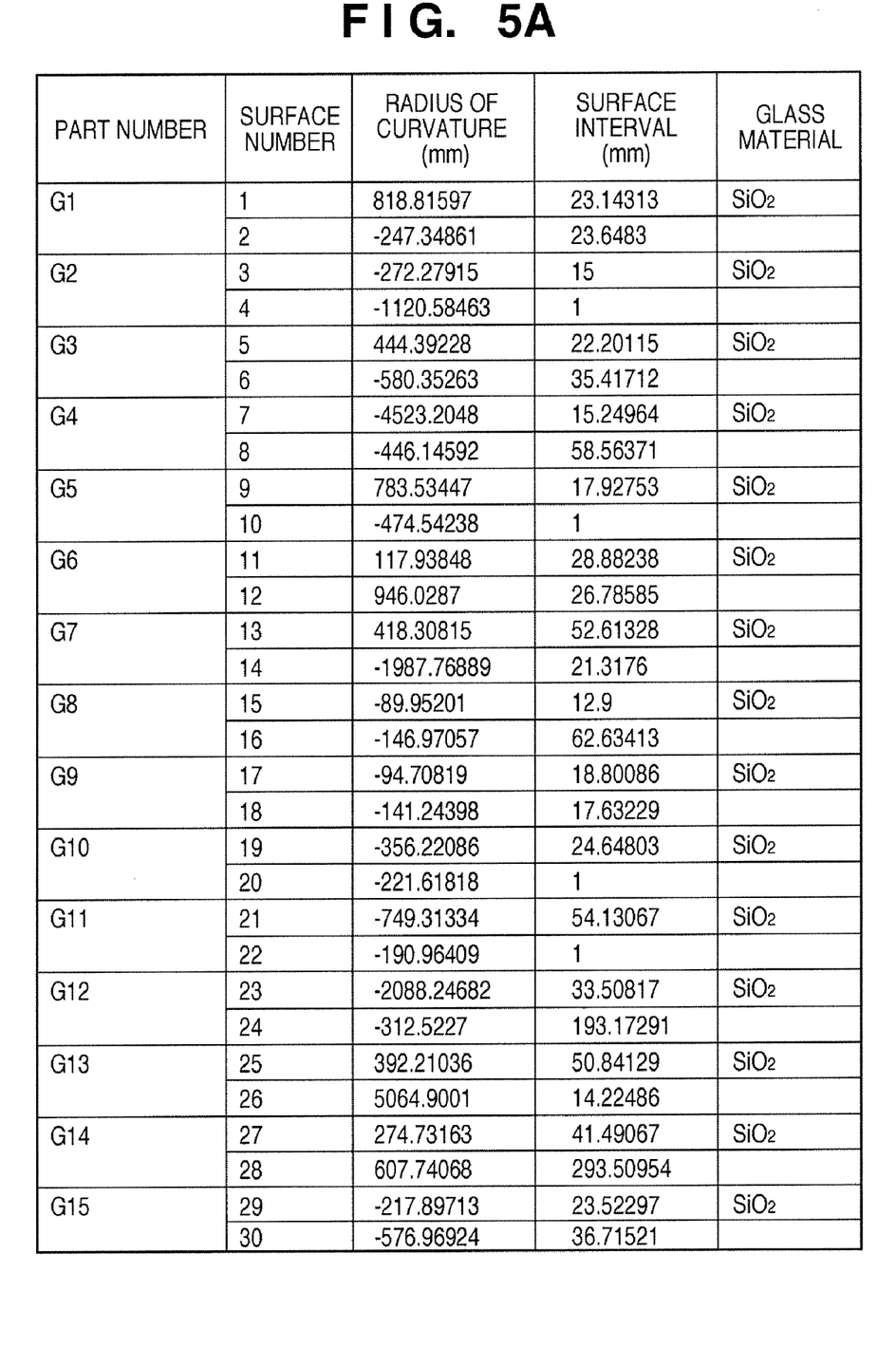
FIG. 5A is a table showing design data of the projection optical system shown in FIG. 4.
Figure 5B:
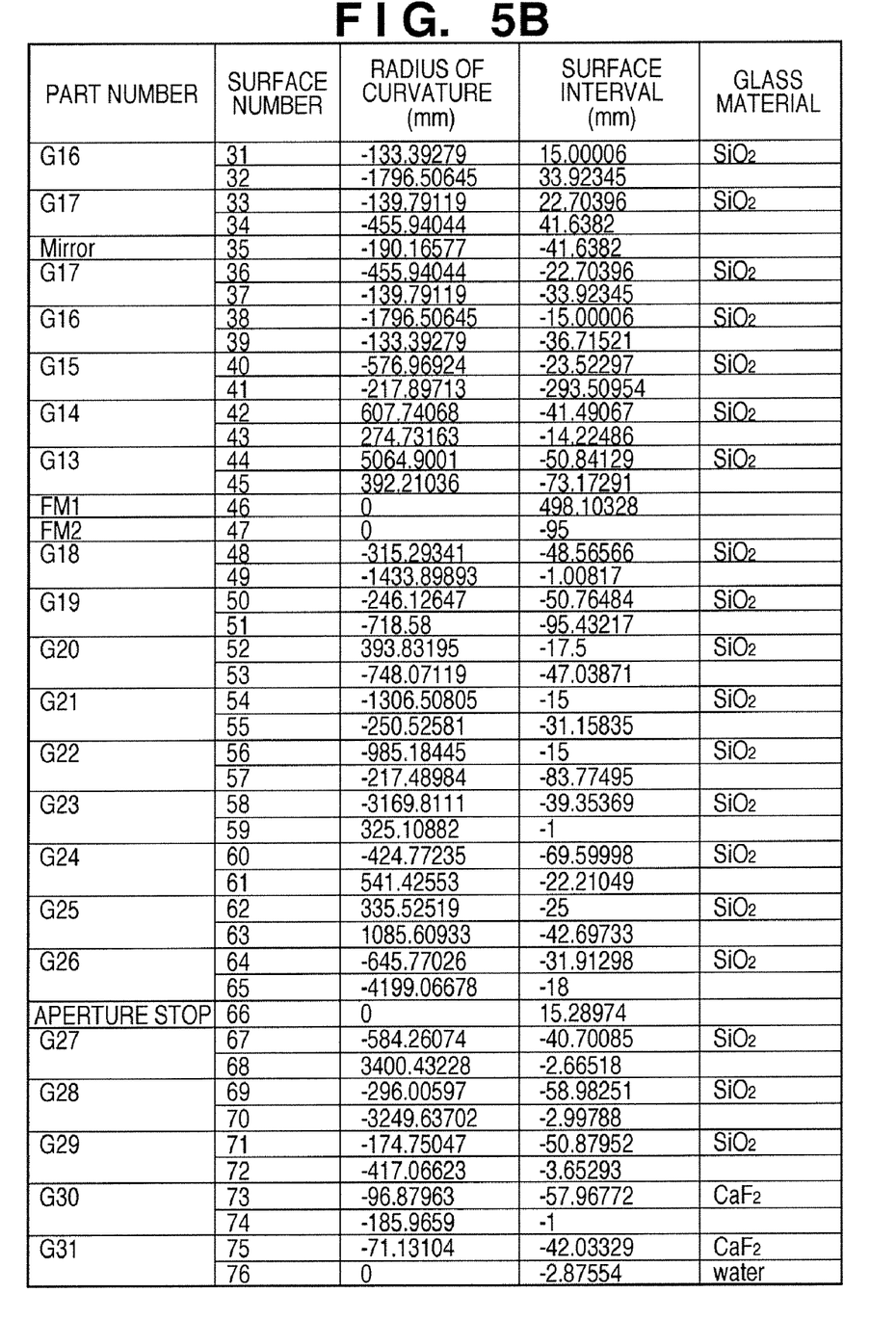
FIG. 5B is a table showing the design data of the projection optical system shown in FIG. 4.
Figure 6:
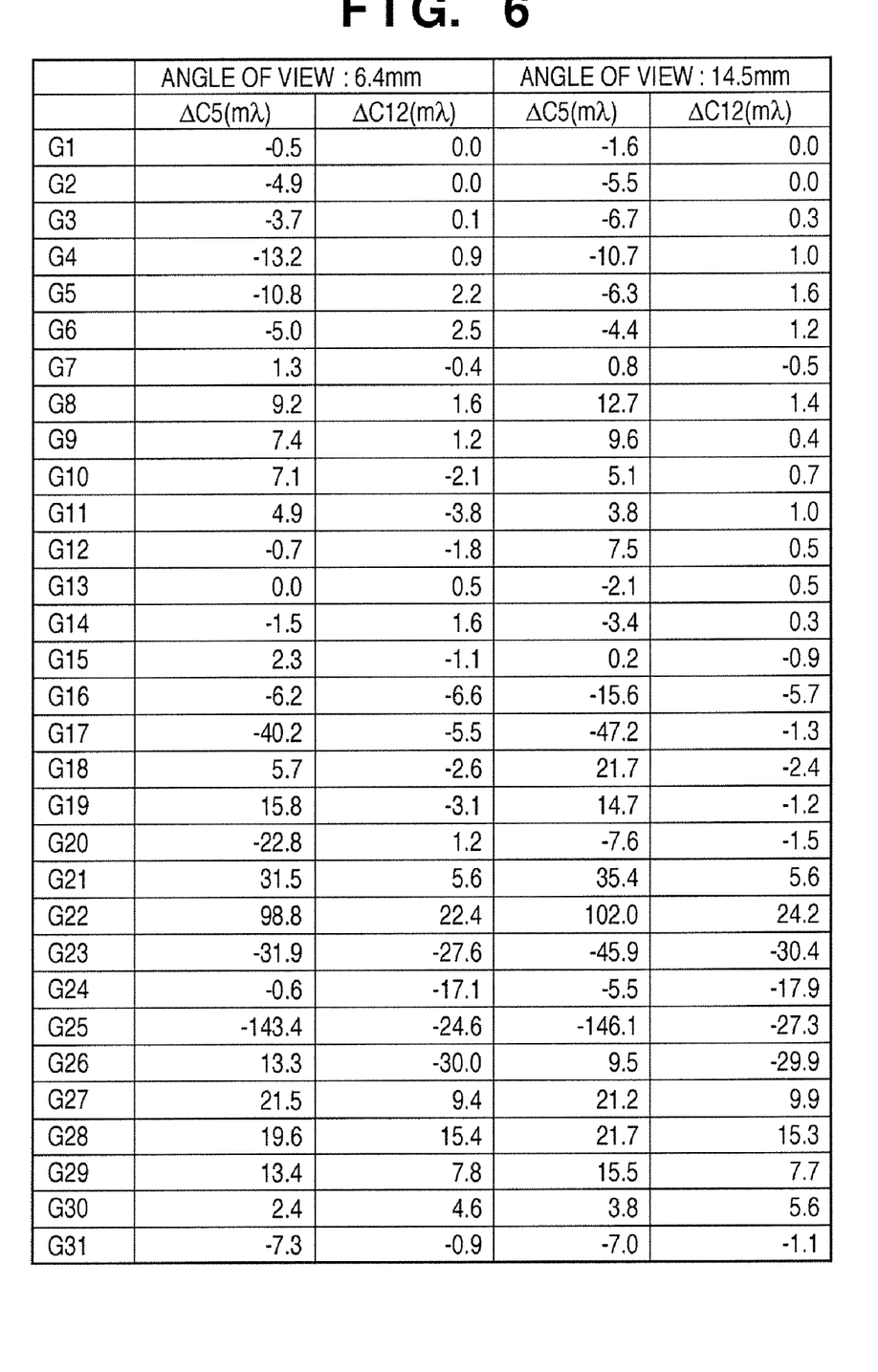
FIG. 6 is a table showing the amounts of changes in (i.e., the sensitivities to) the Zernike 2 θ components (C5 and C12 terms) of wavefront aberration assuming that a first optical element 11a (G25) and second optical element 11b (G26) have deformed by their own weights.

FIG. 4 is a sectional view showing an arrangement of the projection optical system 4. FIGS. 5A and 5B are tables showing design data of the projection optical system 4 shown in FIG. 4. In this example, the exposure light is an ArF laser beam. FIG. 6 is a table showing the amounts of changes in (i.e., the sensitivities to) the C5 and C12 terms of wavefront aberration assuming that the first optical element 11a (G25) and second optical element 11b (G26) have deformed by their own weights. Note that the respective values are obtained at image heights of 6.4 mm and 14.5 mm on the surface of the substrate 5.

The two optical elements 11a and 11b have different sensitivities and are situated near the pupil of the projection optical system 4. In this example, lens G25 is selected as the first optical element 11a, and lens G26 is selected as the second optical element 11b.

Let $\Delta L1$ be the driving amount of the first optical element 11a (lens G25), and $\Delta L2$ be the driving amount of the second optical element 11b (lens G26). Then, based on FIG. 6, amounts of changes $\Delta C5$ and $\Delta C12$ of the C5 and C12 terms are given by:

$$\Delta C5 = -143.4 \times \Delta L1 + 13.3 \times \Delta L2 \quad (2)$$

$$\Delta C12 = -24.6 \times \Delta L1 - 30.0 \times \Delta L2 \quad (3)$$

When the correction targets C5 and C12 are given, $\Delta L1$ and $\Delta L2$ can be calculated by:

$$\Delta L1 = k \times (-30.0 \times \Delta C5 - 13.3 \times \Delta C12) \quad (4)$$

$$\Delta L2 = k \times (24.6 \times \Delta C5 - 143.4 \times \Delta C12) \quad (5)$$

Note that $k = (4629.18)^{-1}$

The use of the above-described values allows high-accuracy adjustment of the low-order component (C5 term) and high-order component (C12 term) generated by exposure heat. Driving three or more optical elements makes it possible to adjust astigmatism components of higher orders.

Rotating the driving mechanisms 12a and 12b of the first and second optical elements 11a and 11b through 45° also makes it possible to adjust both the C6 and C13 terms.

APPLICATION EXAMPLE

A device manufacturing method according to a preferred embodiment of the present invention is suitable to manufacture, for example, a semiconductor device and liquid crystal device. This method can include steps of transferring the pattern of an original onto a photosensitive agent applied on a substrate using the above-described exposure apparatus, and developing the photosensitive agent.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2007-163018, filed Jun. 20, 2007, which is hereby incorporated by reference herein in its entirety.

What is claimed is:

1. An exposure apparatus which exposes a substrate, comprising:
    a projection optical system which includes a first optical element and a second optical element and is configured to project a pattern of an original onto the substrate;
    a first driving mechanism configured to drive said first optical element;
    a second driving mechanism configured to drive said second optical element; and
    a control unit configured to control said first driving mechanism and said second driving mechanism so as to adjust astigmatism of said projection optical system,
    wherein an amount of change in a first order component of the astigmatism and an amount of change in a second order component of the astigmatism upon driving said first optical element by said first driving mechanism hold a first relationship,
    an amount of change in the first order component of the astigmatism and an amount of change in the second order component of the astigmatism upon driving said second optical element by said second driving mechanism hold a second relationship different from the first relationship, and
    the first optical element deforms upon being driven by said first driving mechanism so that the astigmatism changes, and said second optical element deforms upon being driven by said second driving mechanism so that the astigmatism changes.

2. The apparatus according to claim 1, wherein the first relationship and the second relationship each between the amounts of changes in the first order component and the second order component exhibit linear characteristics.

3. The apparatus according to claim 1, wherein a ratio between the amounts of changes in the first order component and the second order component in the first relationship has a sign opposite to that of a ratio between the amounts of changes in the first order component and the second order component in the second relationship.

4. The apparatus according to claim 1, wherein said first optical element and said second optical element are situated near a pupil of said projection optical system.

5. The apparatus according to claim 1, wherein the first order component and the second order component respectively include an astigmatism component of a first order and an astigmatism component of a second order higher than the first order in Zernike polynomials.

6. A device manufacturing method comprising the steps of:
exposing a substrate using an exposure apparatus defined in claim 1; and developing the substrate.

7. The apparatus according to claim 1, wherein the first order component and the second order component respectively include the C5 and C12 terms of Zernike polynomials, and the first driving mechanism and the second driving mechanism respectively rotate the first optical element and the second optical element to adjust both the C6 and C13 terms.

8. The apparatus according to claim 1, wherein each of the first optical element and the second optical element includes a lens.

* * * * *